(12) United States Patent
Jang (10) Patent No.: US 6,720,611 B2
(45) Date of Patent: Apr. 13, 2004

(54) FABRICATION METHOD FOR FLASH MEMORY

(75) Inventor: Wen-Yueh Jang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/055,886

(22) Filed: Jan. 28, 2002

(65) Prior Publication Data

US 2003/0141535 A1 Jul. 31, 2003

(51) Int. Cl.[7] ............................................. H01L 29/778

(52) U.S. Cl. ........................ 257/315; 257/316; 257/321

(58) Field of Search .................................. 257/315, 316, 257/330; 438/257, 259, 264, 267, 270; 253/321, 331

(56) References Cited

U.S. PATENT DOCUMENTS

| | | | | |
|---|---|---|---|---|
| 5,567,635 A | * | 10/1996 | Acovic et al. | |
| 5,721,442 A | * | 2/1998 | Hong | 257/316 |
| 5,943,572 A | * | 8/1999 | Krautschneider | 257/315 |
| 6,159,801 A | * | 12/2000 | Hsieh et al. | 257/330 |
| 6,346,443 B1 | * | 2/2002 | Lojek | 438/259 |
| 2002/0024081 A1 | * | 2/2002 | Gratz | 257/301 |

* cited by examiner

Primary Examiner—Tuan H. Nguyen
(74) Attorney, Agent, or Firm—Dickinson Wright PLLC (57) ABSTRACT

The present invention describes a method for fabricating flash memory. In accordance with the present invention, the forming of the floating gate does not require an additional photolithography step. As a result, the misalignment problem between the floating gate and the active area may be resolved. On the other hand, because of the specific floating gate structure of the present invention, high coupling capacitance between the floating gate and control gate can be achieved by recessing the shallow trench isolation more. Therefore, the method does not sacrifice the whole cell size.

12 Claims, 7 Drawing Sheets

FABRICATION METHOD FOR FLASH MEMORY

FIELD OF THE INVENTION

The present invention relates to a fabrication method for a flash memory, and more particularly relates to a fabrication method for a self-aligned flash memory.

BACKGROUND OF THE INVENTION

A computer with advanced function must process a large amount of data, which requires more memory. At the end of 1980, Intel developed the "flash memory" which is based on the same framework as electrically erasable programmable read only memory, EEPROM. Because of the number of times of data is stored, read and erased is not limited, and the flash memory has become the fastest memory developed.

Nonvolatile memory, especially flash memory, is becoming more and more important in many applications. In recent years, the demand for flash memory has exceeded that for other kinds of memory. Therefore, how to develop the new generation of technology and how to reduce the area of flash memory are the challenges facing engineers.

The framework of the flash memory is similar to that of the EPROM, having a stacked gate structure comprising a control gate and a floating gate. The only difference is the thin and high quality tunnel silicon oxide layer under the floating gate. When the program is written into the flash memory, the hot carrier tunnels through the thin tunnel silicon oxide layer to the floating gate, which is similar in operational method to the EPROM. When erasing the program, a negative voltage is applied to the control gate to force the carrier trapped in the floating gate to tunnel through the thin tunnel silicon oxide layer to the source area.

Although flash memory and the EEPROM have the same framework, the erasing method is different. The volume of the flash memory is much smaller than that of the EEPROM. Moreover, the time required to erase data is about one to two seconds. This is much faster than EPROM, which requires twenty minutes and ultraviolet (UV) rays as the source to erase the data. Therefore, the flash memory has advantages over EPROM and EEPROM.

Figure 1:
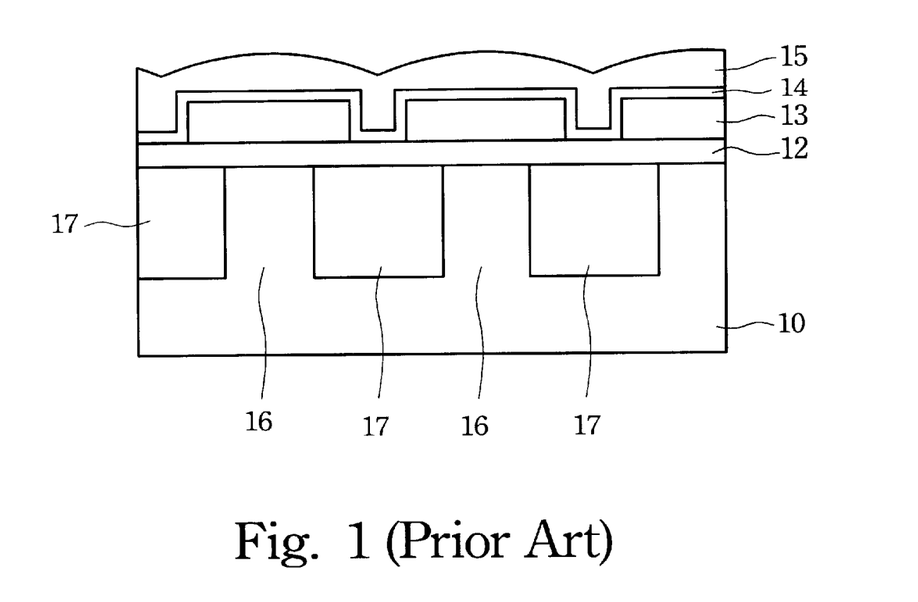
FIG. 1 illustrates a cross-sectional view of a semiconductor wafer in accordance with the conventional method to form the flash memory.

FIG. 1 illustrates a flash memory fabricated by the conventional method. It comprises using a photomask (not shown in the figure) to define the active area 16 on the P-type substrate 10. Next, a dry etching is performed to create a recess in the wafer for formation of shallow trench isolation 17 (STI), the depth thereof being about 200 to 400 nm in the substrate 10. Then the photomask is removed and a stacked gate structure is formed over the substrate 10. The stacked gate structure includes a tunnel silicon oxide layer 12 and a floating gate 13. Next, an ONO (oxide/nitride/oxide) insulating layer 14 and control gate layer 15 are sequentially formed over the tunnel silicon oxide layer 12 and a floating gate 13. It is noted that additional photomask is required to define the area of the floating gate 13. Therefore, at least two different kinds of photomasks are required to form the floating gate 13 and active area 16 in the conventional method.

It is assumed that a V voltage is applied to the control gate layer 15 and a zero voltage is applied to the substrate 10. Because the substrate 10, the floating gate layer 13 and the control gate layer 15 present the capacitance coupling state, the floating gate voltage ($V_{FG}$) is determined according to the following formula:

$$V_{FG} = \frac{V \times C_2}{C_1 + C_2}$$

$C_1$ is the capacitance between the substrate 10 and the floating gate 13. $C_2$ is the capacitance between the floating gate 13 and the control gate layer 15.

When the channel length is reduced to 0.18 μm, even to 0.13 μm, the conventional non-using self aligned fabrication technology of flash memory experiences misalignment between the floating gate layer 13 and active area 16. On the other hand, this kind of flash memory that injects a carrier into the floating gate layer to store data has a faster injection velocity if the tunnel silicon oxide layer 12 is thinner or the floating gate layer 13 covers more of the source area. However, the thinner tunnel silicon oxide layer 12 also reduces the data retention time.

On the other hand, under constant applied voltage, the voltage $V_{FG}$ of the floating gate layer 13 can be increased by increasing the capacitance of C2 such that the applied voltage can be coupled more to the floating gate layer 13. That is, the area between the floating gate layer 13 and the control gate layer 15 is increased. The foregoing method can lower the applied voltage to generate the tunnel current of tunnel silicon oxide layer 12. However, because of the limit of photolithography process, the isolation distance between the floating gates is also limited. Therefore, a greater area of shallow trench isolation 17 is necessary because of the limit of photolithography process when using the method of increasing the covering area to increase the capacitance of C2. This, in turn, increases the area of the flash memory. A conventional method of using the spacer process to overcome the foregoing drawback also requires a photolithography process so that the whole reduced area of flash memory is still limited.

Therefore, resolution of the misalignment problem between the floating gate 13 and active area 16 and how to increase the capacitance of C2 but not increase the whole area of flash memory is the greatest challenge facing engineers today.

SUMMARY OF THE INVENTION

In accordance with the forgoing description, two photo masks are respectively required to form the floating gate layer and the active area of the conventional method. Precise control is very difficult to attain during the alignment process. Therefore, one of the purposes of the present invention is to provide a self-aligned process for flash memory to resolve the misalignment problem.

Another purpose of the present invention is to provide a new kind of floating gate structure and a related process method. The method may increase the coupling area between the floating gate layer and the control gate layer to raise the coupling capacitance thereof but not increase the whole area of the flash memory.

The process method of the present invention comprises these steps. Firstly, a shallow trench isolation is formed on a semiconductor wafer to form the active area islands. Next, the shallow trench isolation is etched to form an indented shallow trench isolation which forms the active area islands. A silicon oxide layer is formed over the indented shallow trench isolation and the surface of the wafer. An anisotropic dry etching step is performed on the silicon oxide layer to form dielectric spacers surrounding the sides of the active area. Then, a thermal process is performed to form a thin tunnel silicon oxide layer. A doped polysilicon layer is deposited as a floating gate over the tunnel silicon oxide layer, dielectric spacers and indented shallow trench isolation. Next, the indented shallow trench isolation between the active area islands is filled with a silicon nitride layer. Then, a thermal oxide layer is grown on the polysilicon layer not covered by the silicon nitride layer. Hot phosphoric acid is used to remove the silicon nitride layer. Using the thermal oxide layer as a mask, the polysilicon layer is etched to isolate the floating gate. Next, a dielectric layer comprising oxide-nitride-oxide (O/N/O) is sequentially deposited on the surface. A doped polysilicon gate is formed as a control gate over the dielectric layer. Then, conventional photolithography and etching processes are performed on the gate structure to form the word line. Finally, a source and drain area ion implant is performed, after which the self-aligned flash cell is complete.

Formation of a floating gate according to the present invention does not require a photolithography step so the method does not suffer misalignment between the floating gate and the active area. On the other hand, the active area islands are formed by etching the shallow trench isolation. Therefore, the coupling area between the floating gate layer and the control gate layer may be increased by raising the etching depth so the coupling capacitance is increased but does not affect the whole area of flash memory.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 13 illustrates a top view of the semiconductor wafer.

DETAILED DESCRIPTION OF THE PREFERRED EMBODIMENT

Without limiting the spirit and scope of the present invention, the method proposed in the present invention is illustrated with one preferred embodiment regarding a fabricating method of flash memory. Skill artisans, upon acknowledging the embodiments, can apply the fabricating method according to the present invention to any kind of flash memory to eliminate the misalignment drawback existing in the conventional method arising from use of different photo masks to form a floating gate layer and active area. On the other hand, the structure of the flash memory in accordance with the present invention may raise the coupling area between the floating gate layer and the control gate layer which means an increase in the coupling capacitance thereof but not the whole area. The application of the present invention is not limited by the following embodiment.

As according to the foregoing description, when a voltage is applied on the control gate, the floating gate voltage $V_{FG}$ can be increased by raising the coupling capacitance between the floating gate layer and the control gate layer; in other words, the area between the floating gate layer and the control gate layer is increased. However, because of the resolution limits of the photolithography process, the isolation distance between the floating gates will also be limited. In particular, when the channel length is reduced from 0.18 $\mu$m to 0.13 $\mu$m, or even to the smallest size possible, it is necessary to find another way to resolve the foregoing problems. Therefore, the present invention provides a fabricating method that etches the shallow trench isolation to form active area islands to increase the area between the floating gate layer and the control gate layer. That is to say, the coupling capacitance is increased.

Figure 2:
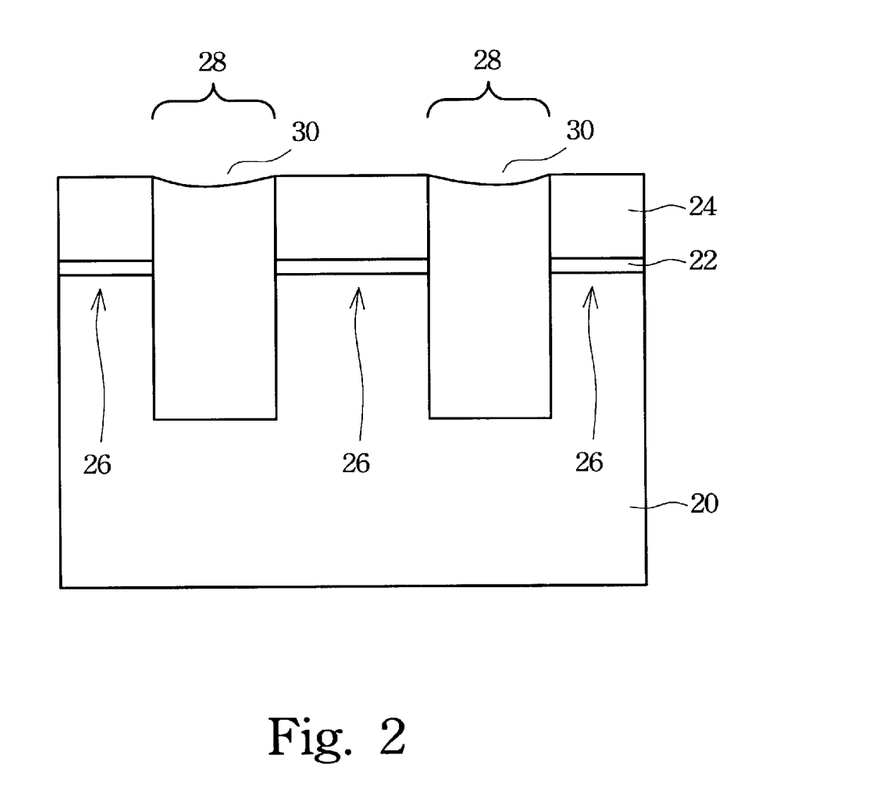
FIG. 2 to FIG. 13A illustrate cross-sectional views of the semiconductor wafer in accordance with the present invention to form the flash memory.

The details of the present invention can be understood by referring to the drawings. FIG. 2 shows a cross-sectional view of a semiconductor wafer. Firstly, a pad oxide 22 is formed on a semiconductor wafer 20 by a thermal process as a buffer between the silicon nitride layer 24 deposited over the pad oxide 22 and the semiconductor wafer 20. Next, active area 26 is defined by a patterned photoresist (not shown in the figure). Then, a dry etching is performed to form a shallow trench isolation 28 whose depth is about 300 to 450 nm. The patterned photoresist is removed and then, a chemical vapor deposition method is performed to deposit a silicon oxide layer 30 which fills the shallow trench isolation 28. Chemical mechanical polishing is performed on the wafer with the silicon nitride layer 24 serving as an polishing stop layer.

Figure 3:
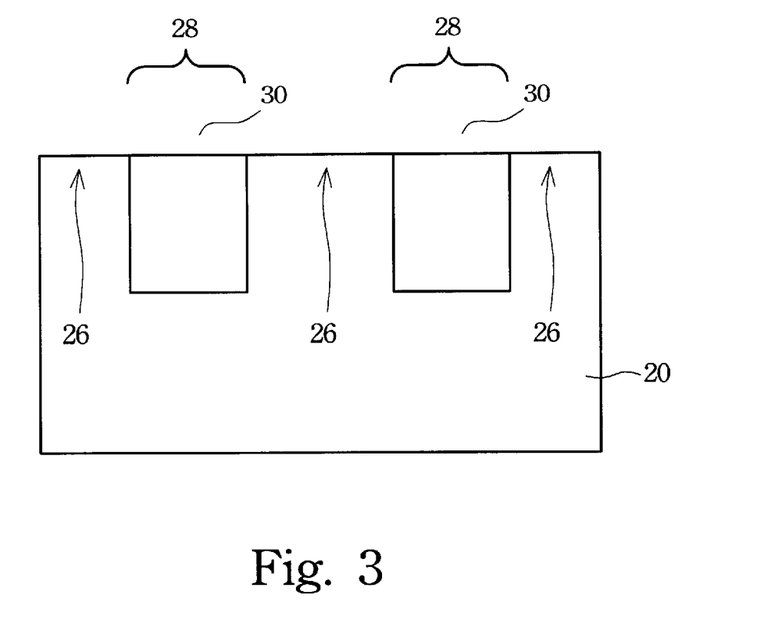

Next, referring to FIG. 3, hot phosphoric acid is used to remove the silicon nitride layer and hydrofluoric acid is used to etch the pad oxide 22. The foregoing shallow trench isolation 28 may also be replaced by filled oxide formed by the LOCOS.

Figure 4:
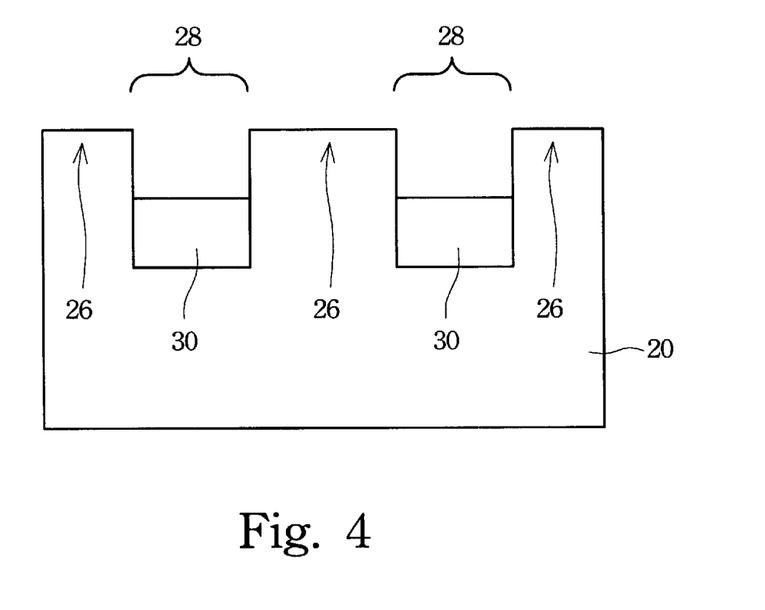

Then, referring to FIG. 4 showing a cross-sectional view of the present invention, $CF_4$ plasma is used to perform selective dry etching for removing part of the silicon oxide layer 30 to creats a recess in the shallow trench isolation 28. After the selective dry etching, a gap exists between the active areas 26, that is, the active area island. The etching depth of the recessed shallow trench isolation 28 is about 200 to 400 angstroms, which depth depends on the area size required between the floating gate layer and the control gate layer.

Figure 5:
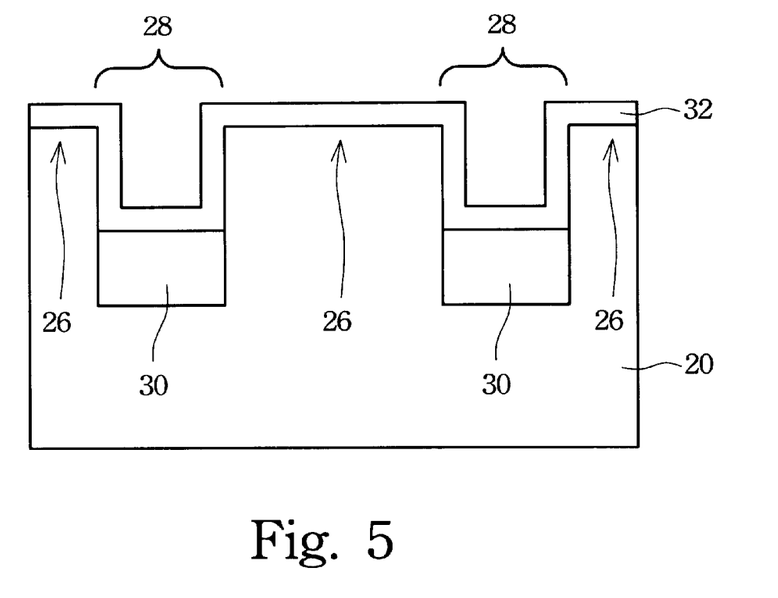

Next, referring to FIG. 5, a conformal dielectric layer 32 is deposited over the surface of the active area 26 and the recessed shallow trench isolation 28. The conformal dielectric layer 32 has a high etching selectivity with that of silicon. The material of dielectric layer 32 may be silicon oxide with a thickness of about 400 to 800 angstroms.

Figure 6:
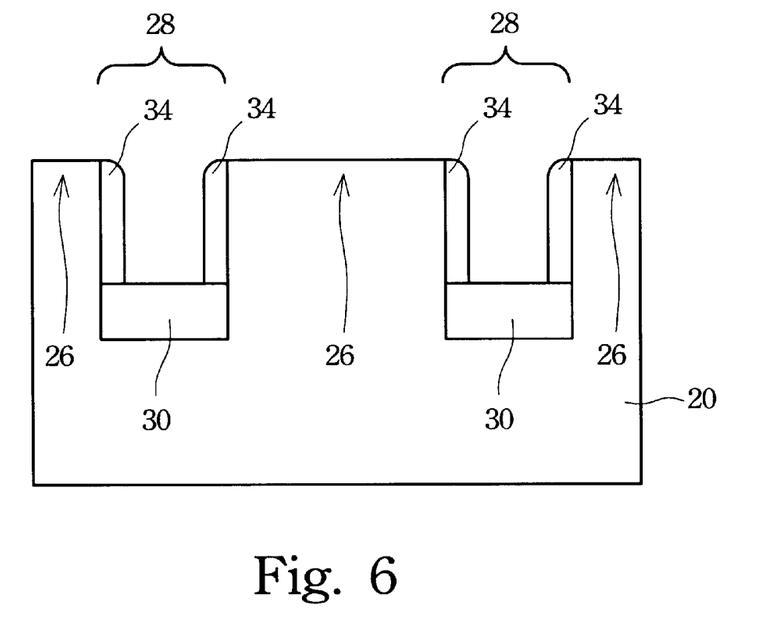

Referring to FIG. 6, anisotropic etching is performed on the semiconductor wafer covered by the dielectric layer 32 to form spacers 34 on the sides of the active area. The step utilizes the anisotropic of dry etching to remove the dielectric layer 32 based on the deposition thickness. Because the thickness of the dielectric layer 32 located on the sides of the active area 26 is thicker than other parts of the wafer, part of the dielectric layer located on the sides of the active area 26 is not removed by the anisotropic etching. The final structure is shown in FIG. 6.

Figure 7:
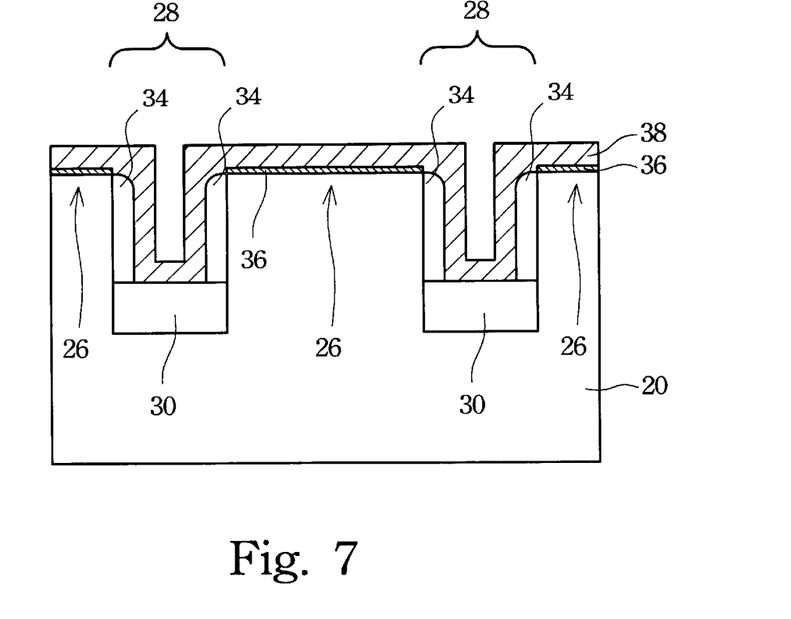

Referring to FIG. 7 showing a cross-sectional view of a wafer, a silicon oxide layer is formed over the surface of the active area 26 as a tunnel silicon oxide layer 36. In accordance with the preferred embodiment of the present invention, a thermal process is performed to form the tunnel silicon oxide layer. Oxide is used as the ambient gas and the process temperature is about 800°C.to 1000°C. The thickness of the tunnel silicon oxide layer 36 may be controlled by the pressure and processing time of the thermal process. The thickness of the tunnel silicon oxide layer 36 is about 80 to 100 angstroms.

Referring to FIG. 7 again, a conformal amorphous silicon or polysilicon layer 38 is deposited over the surface of the wafer by chemical vapor deposition (CVD). Other methods also can be used to form this layer. The thickness of the conformal amorphous silicon or polysilicon layer 38 is about 200 to 800 angstroms. Because the conformal amorphous silicon or polysilicon layer 38 does not couple with the other conductor, the layer is called a floating gate in the flash memory. The floating gate is used to store the charge.

This amorphous silicon or polysilicon layer 38 is in situ doped with an N-type or P-type dopant during deposition. In accordance with the preferred embodiment, the dosage of the ions is about $1 \times 10^{18}$ to $1 \times 10^{21}$ cm$^{-3}$.

Figure 8:
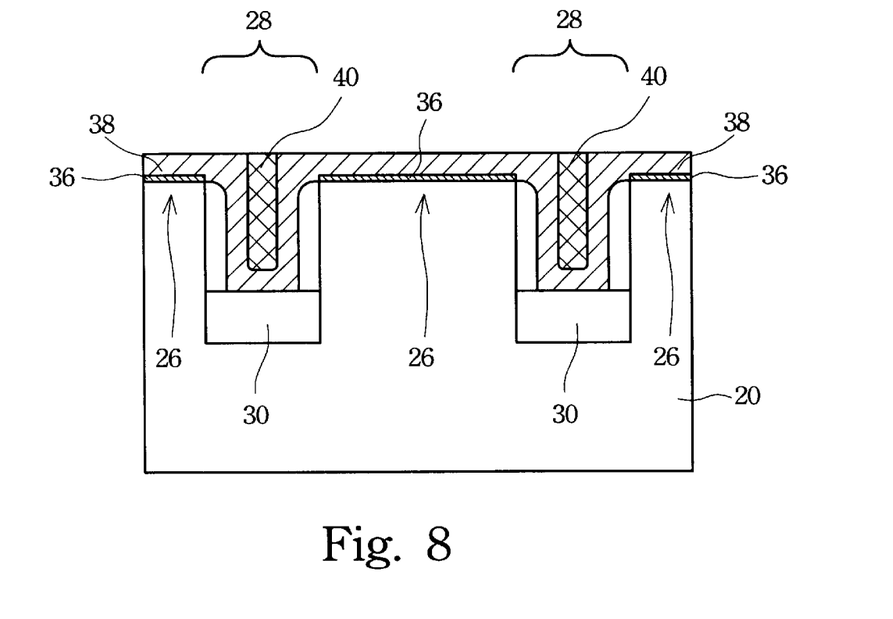

Referring to FIG. 8 showing the cross-sectional view of a wafer, next, the recessed shallow trench isolation between the active area 26 islands is filled with a sacrificial film that has a high polishing rate or high etching rate difference with that of floating gate and has a high resistance to oxidation. The silicon nitride layer 40 is used as the sacrificial film. Then, the silicon nitride layer 40 outside the recessed shallow trench isolation is removed by CMP. The reason for using the silicon nitride layer 40 as the sacrificial film is that it has a high resistance to oxidation. Therefore, the oxide layer does not exist on the surface of the silicon nitride layer 40 after the thermal oxidation process.

Figure 9:
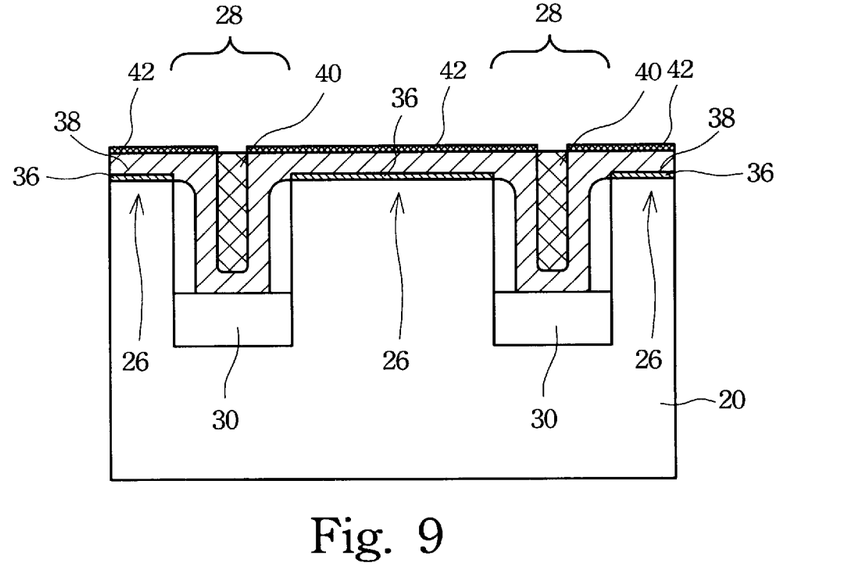

Referring to FIG. 9 showing the cross-sectional view of a wafer, a thermal oxidation process is performed to form the silicon oxide layer 42 over the doped conformal amorphous silicon or polysilicon layer 38 and the thickness of the silicon oxide layer 42 is about 100 to 300 angstroms. In addition to silicon nitride layer 40 which cannot be oxidized, parts of the surface of the doped conformal amorphous silicon or polysilicon layer 38 which are covered by the silicon nitride layer 40 will not be oxidized either.

Figure 10:
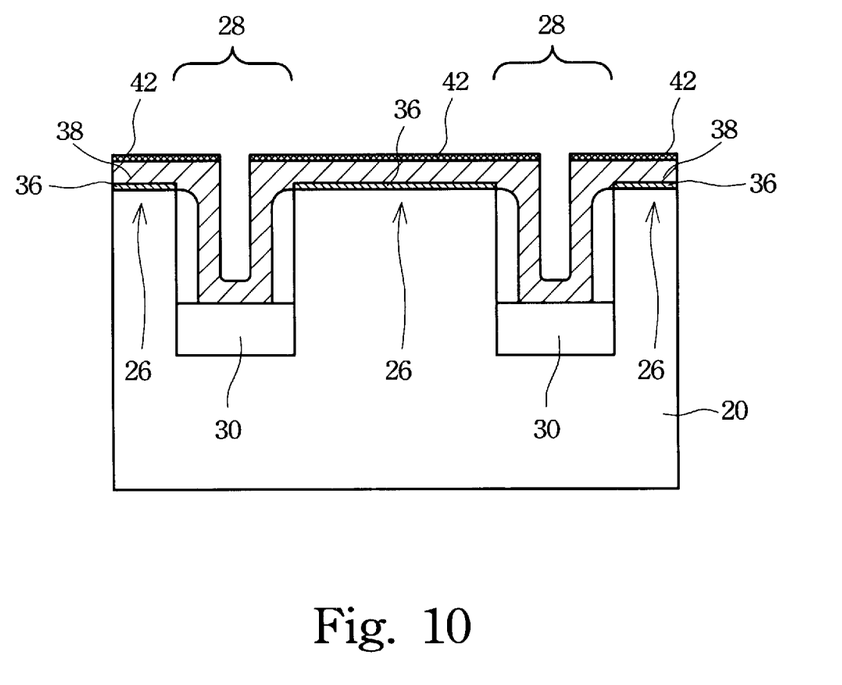

Next, referring to FIG. 10 showing the cross-sectional view of a wafer, in this step, a hot phosphoric acid is used to remove the silicon nitride layer.

Figure 11:
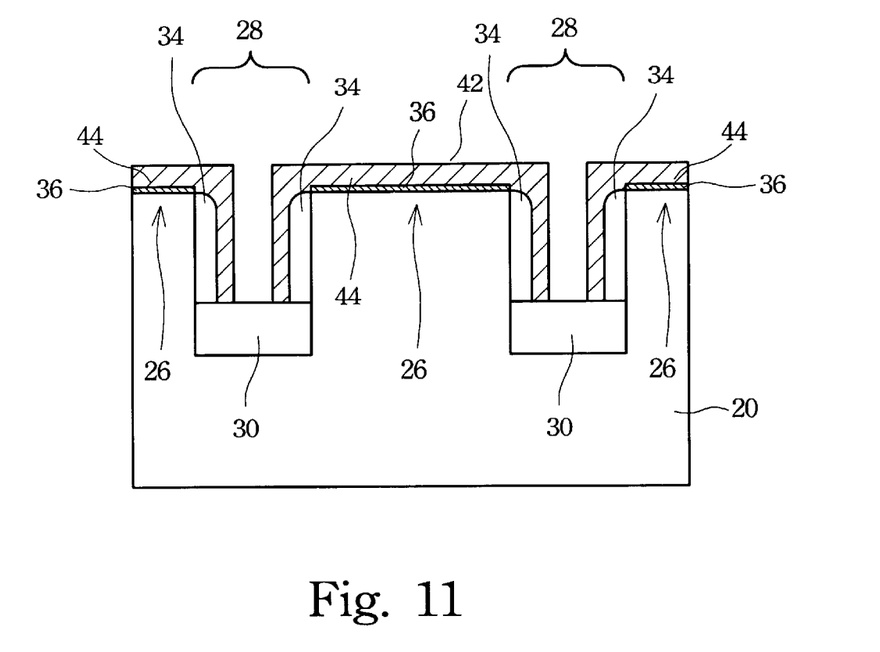

Referring to FIG. 11 showing the cross-sectional view of a wafer, while using the silicon oxide layer 42 as a mask, anisotropic etching is performed to remove parts of the doped amorphous silicon or polysilicon layer 38 which are not protected by the silicon oxide layer 42 to form the isolated floating gate 44. The floating gate 44 is self-aligned with the active area 26. This is the method in accordance with the present invention that does not use any photolithography steps to form the floating gate 44. The method thus eliminates misalignment between the floating gate 44 and the active area 26. Then, the silicon oxide layer 42 is removed, either by a dry etching process or by hydrofluoric acid.

Figure 12:
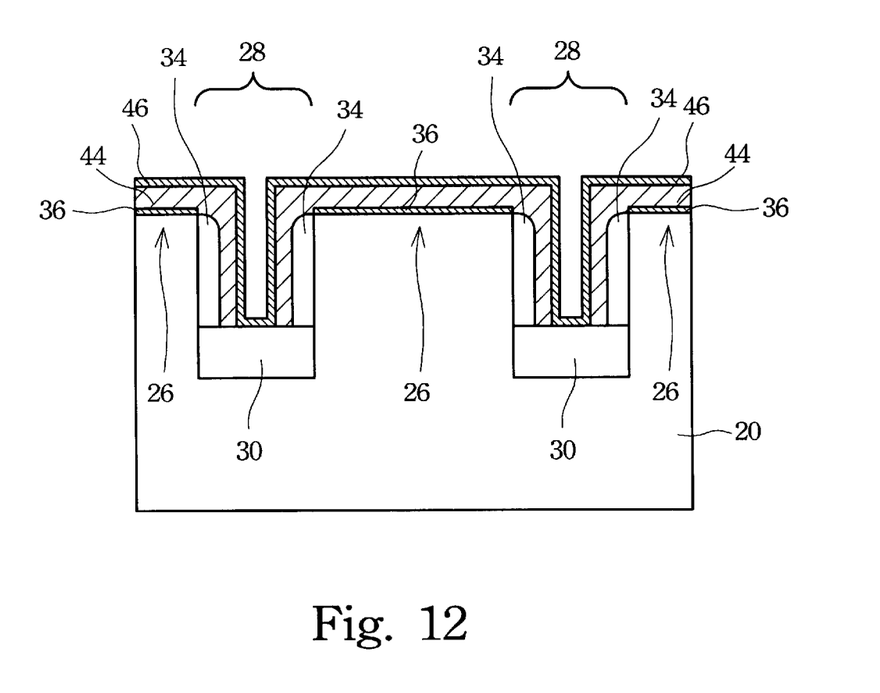

Referring to FIG. 12 showing the cross-sectional view of a wafer, a conformal dielectric layer 46 comprising oxide-nitride-oxide (O/N/O) is formed on the surface of the floating gate 44 and shallow trench isolation 28. The main purpose of this layer is to isolate the floating gate from the control gate which will be deposited in the following process and increase the capacitance between the floating gate and the control gate. In the process of the O/N/O layer, firstly, a thermal oxidation process is performed to form the silicon oxide layer which is the bottom layer of the O/N/O dielectric layer 46 having a thickness of about 20 to 120 angstroms. Then, a silicon nitride layer is deposited on the surface of the silicon oxide layer by a low-pressure chemical vapor deposition method (LPCVD). Next, a chemical vapor deposition oxide layer is formed as the top layer of the O/N/O dielectric layer 46 to complete the whole structure of the O/N/O dielectric layer 46. The thickness of the silicon nitride layer is about 30 to 120 angstroms and the thickness of the top silicon oxide is about 20 to 80 angstroms.

Figure 13A:
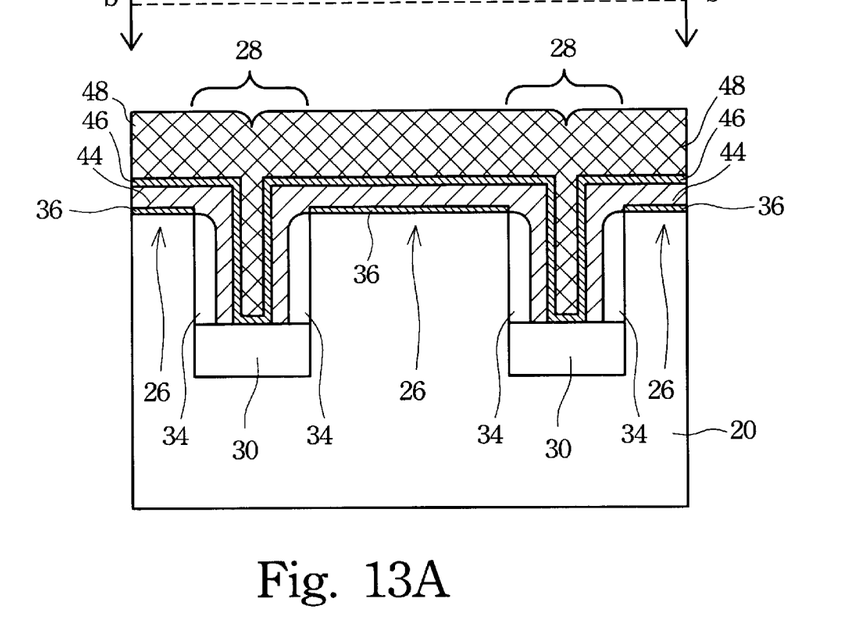

Referring to FIG. 13A showing the cross-sectional view of a wafer, a conductive layer 48 is formed over the O/N/O dielectric layer 46 by chemical vapor deposition to a thickness of about 1000 to 3000 angstroms. The material of the conductive layer 48 may be doped polysilicon, doped amorphous silicon or silicide, wherein the silicide may comprise doped polysilicon and metal silicide. The conductive layer 48 is called the control gate layer which controls data access.

Still referring to FIG. 13A showing the cross-sectional view of a wafer, a patterned photoresist (not shown in the figure) formed on the conductive layer 48 is used to define the word line. As show in FIG. 13B, a conventional etching process is performed on the conductive layer 48 with the patterned photoresist serving as a mask to form the word line 50. The FIG. 13B is a top view of FIG. 13A in the direction bb', and the number 50 represents the word line.

Figure 13B:
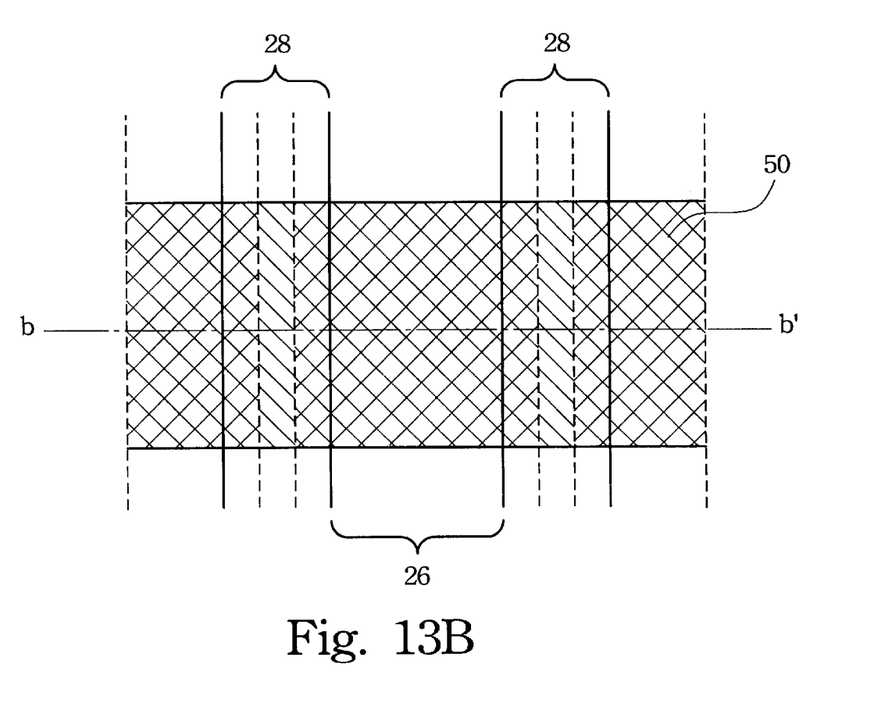

Still referring to FIG. 13B, a top view of the FIG. 13A along the direction bb' is shown. A patterned photoresist (not shown in the figure) exposing the source/drain regions is deposited over the surface of the wafer to define the source/drain regions in the active area 26. Next, an N+ ion implantation (N-type substrate using P+ ion implantation) is applied to the source/drain region with the patterned photoresist serving as the mask. The energy used to perform the ion implant is about 10 to 60 Kev and the dosage of the ions is about $1 \times 10^{14}$ to $1 \times 10^{16}$ cm$^{-2}$. Finally, the process of the self-aligned flash memory is completed after removing the patterned photoresist.

From the above description, the proposed self-aligned process of the flash memory in accordance with the present invention has the following advantages compared with that of the conventional method. Because the floating gate 44 of the present invention is formed without requiring an additional photolithography step, it avoids the misalignment seen in the conventional method requiring two different photolithography steps to form the floating gate and the control gate, respectively. On the other hand, because of the specific floating gate 44 structure of the present invention, high coupling capacitance between the floating gate 44 and control gate 48 can be achieved without sacrificing the cell size. If the capacitance between the floating gate 44 and control gate 48 needs to be increased, it needs only to deepen the recess of the shallow trench isolation.

As understood by a person skilled in the art, the foregoing preferred embodiments of the present invention are illustrative of the present invention rather than limiting of the present invention. The present invention is intended to cover various modifications and similar arrangements. All these are included within the spirit and scope of the appended claims, the scope of which should be accorded the broadest interpretation so as to encompass all such modifications and similar structures.

What is claimed is:

1. A flash memory structure formed on a semiconductor substrate having a plurality of active area islands isolated by a recessed isolation structure, said structure comprising:

a plurality spacers respectively located on sides of said plurality of active area islands;

a plurality of tunnel oxide layers respectively located over top surfaces of said plurality of active area islands;

a plurality of doped silicon layers respectively located over said tunnel oxide layers and said spacers, wherein said doped silicon layers are formed as floating gates;

a dielectric layer located over surfaces of said doped silicon layers and said recessed isolation structure; and a conductive layer located over said dielectric layer, wherein said conductive layer is a control gate.

2. The flash memory structure of claim 1, wherein said isolation structure is shallow trench isolation.

3. The flash memory structure of claim 1, wherein said isolation structure is a field oxide layer.

4. The flash memory structure of claim 1, wherein a surface of said recessed isolation structure is about 200 to 400 angstroms lower than a surface of said active area.

5. The flash memory structure of claim 1, wherein said doped silicon layer uses N-type doping.

6. The flash memory structure of claim 1, wherein said doped silicon layer uses P-type doping.

7. The flash memory structure of claim 1, wherein dosage of said doped silicon layer is about $1\times10^{18}$ to $1\times10^{21}$ $cm^{-3}$.

8. The flash memory structure of claim 1, wherein said dielectric layer comprises oxide/nitride/oxide.

9. The flash memory structure of claim 1, wherein said conductive layer is a doped polysilicon layer.

10. The flash memory structure of claim 1, wherein said conductive layer is a doped amorphous silicon layer.

11. The flash memory structure of claim 1, wherein said conductive layer is a silicide layer.

12. The flash memory structure of claim 1, wherein said tunnel oxide layer is formed by thermal oxidation.

* * * * *